United States Patent
Hild

(10) Patent No.: US 7,928,434 B2
(45) Date of Patent: Apr. 19, 2011

(54) ORGANIC ELECTRONIC COMPONENT WITH DESSICANT-CONTAINING PASSIVATION MATERIAL

(75) Inventor: Olaf Rüdiger Hild, Radebeul (DE)

(73) Assignee: Fraunhofer-Gesellschaft zur Förderung der angewandten Forschung e.V., München (DE)

( * ) Notice: Subject to any disclaimer, the term of this patent is extended or adjusted under 35 U.S.C. 154(b) by 197 days.

(21) Appl. No.: 12/236,623

(22) Filed: Sep. 24, 2008

(65) Prior Publication Data
US 2009/0236717 A1 Sep. 24, 2009

(30) Foreign Application Priority Data
Sep. 26, 2007 (DE) .......... 10 2007 046 018

(51) Int. Cl.
*H01L 31/031* (2006.01)
*H01L 51/00* (2006.01)
*H01L 21/00* (2006.01)

(52) U.S. Cl. .......... 257/40; 257/E51.006; 257/E51.022; 438/99

(58) Field of Classification Search ............ 257/40, 257/E51.006; 438/99
See application file for complete search history.

(56) References Cited

U.S. PATENT DOCUMENTS
2006/0087230 A1* 4/2006 Ghosh et al. .......... 313/512
2006/0128042 A1 6/2006 Gramann
2007/0295385 A1* 12/2007 Sheats et al. .......... 136/251

FOREIGN PATENT DOCUMENTS
DE 102005005579 A1 8/2006
EP 1383182 A2 1/2004
WO 0016938 A1 3/2000
WO 2007013120 A1 2/2007

OTHER PUBLICATIONS
English translation of German Office Action for corresponding Patent Application DE102007046018.1-33 dated Sep. 22, 2008.
German Office Action for corresponding Patent Application DE102007046018.1-33 dated Sep. 22, 2008.

* cited by examiner

*Primary Examiner* — W. David Coleman
(74) *Attorney, Agent, or Firm* — Matthew B. Dernier, Esq.; Gibson & Dernier LLP

(57) ABSTRACT

The invention relates to an organic electronic component, such as e.g. an organic light diode or an organic solar cell with structures made of passivation material, the passivation material comprising at least one dessicant.

37 Claims, 1 Drawing Sheet

ORGANIC ELECTRONIC COMPONENT WITH DESSICANT-CONTAINING PASSIVATION MATERIAL

BACKGROUND

The invention relates to an organic electronic component, such as e.g. an organic light diode or an organic solar cell with structures made of passivation material, the passivation material comprising at least one dessicant.

It is necessary for the function of organic electronic components to keep these components dry over as long a time as possible. Dessicants are used for this purpose in the most varied of ways. Standard dessicants are calcium oxide (CaO) and zeolite-containing products. Products based on calcium oxide are usually glued on in the form of adhesive pads. Liquid dessicants, such as zeolite pastes, are normally applied from a solution. Zeolites must be activated before use, which can be effected for example by infrared radiation and/or by vacuum.

It is disadvantageous in these methods that calcium oxide pads must be glued on in a separate operational procedure and in addition are not transparent, which is disadvantageous in particular for organic light diodes and organic solar cells. Furthermore, the danger exists that the pads detach in the component. Zeolites must be activated in addition in an additional step.

SUMMARY OF THE INVENTION

It is therefore the object of the present invention to indicate an organic electronic component and also a method for production thereof which overcomes the above-mentioned disadvantages. This object is achieved by the organic electronic component according to claim 1, the display according to claim 29 and the method for the production of an organic electronic component according to claim 30. The respective dependent claims indicate advantageous developments of the organic electronic component and of the production method.

The core of the present invention resides in the knowledge that passivation material and dessicant do not require to be applied separately but that the dessicant can be mixed into the passivation material. The passivation material is normally used for structuring purposes and also for electrical insulation, for example for insulating bus bars or metal grids, which serve for improving the current distribution in the case of fairly large surfaces. It is possible to mix dessicant into these for example epoxide- or polyimide-based systems. In the case of a small concentration and fine distribution, a very high transparency can be achieved. Non-active surfaces can be provided in addition with material in one operational step of the passivation application since a large part of the passivated surfaces can be covered by the materials to be protected. As a result, the absorbable water quantity can be increased. Additional activation of the water-absorbing getter (absolutely necessary otherwise with zeolites) can be dispensed with if the substrate is thermally treated before coating in order to remove water adsorbates. In addition, the deposition of the organic materials and also the metal deposition can take place in a vacuum, as a result of which sufficient activation of the dessicant can be achieved. A process step, such as application of adhesive pads or pastes in the glass covers, can hence be dispensed with. In addition to the operational complexity, also the additionally required appliances, such as pick-and-place robots, activation stretches, dispensers and the like, are hence dispensed with.

Furthermore, with suitable choice of thickness of the passivation layer or adhesion of substrate and cover, e.g. glass covers, expensive glass covers with a cavity can be dispensed with. The adhesive can be applied either as a seam, structured or over the entire surface. Also films and thin-film encapsulations or combinations of different techniques are possible.

In particular for components which are dependent upon substrates and glass covers which are as transparent as possible, the active surfaces here can be enlarged.

If the surface area or the volume which is usable for the passivation layer is not adequate, the glass cover or the cover film can be coated in addition with the material. In addition, glass covers with a cavity can be used into which dessicants or passivation with a dessicant can be introduced. This does in fact involve costs but nevertheless has advantages relative to the state of the art since only one material is used instead of two materials. The techniques and operational steps for application are then the same and, with subsequent recycling of the component, fewer materials require to be taken into account.

The material of the passivation layer is advantageously electrically insulating, preferably does not evolve gas in a vacuum, conducts the water sufficiently rapidly to the embedded dessicant and survives the process steps and the activation procedure.

The organic electronic component according to the invention has at least one structure which has at least one passivation material which comprises at least one dessicant. Preferably, the dessicant is mixed into the passivation material. Possibilities of how this mixing-in can take place are described further on in connection with the production method of the component.

It is preferred that the passivation material is electrically insulating so that structuring of the component is consequently possible. Preferably, the structure containing the passivation material is applied in the form of layers or lines. Layers, structures or lines of this type can have a thickness between 20 nm and 5000 µm, preferably between 100 nm and 10 µm. As described, the passivation material can be electrically insulating. In this way, parts of the organic electronic component can be electrically insulated relative to each other by the structure of the passivation material. The structures can hereby be disposed on indium-tin oxide (ITO), but at least one grating or one grid and/or at least one bus bar can also be disposed on the ITO, then at least one of the at least one structures being disposed on the grid and/or on the bus bar or between corresponding elements.

Preferably, the organic electronic component has also at least one organic layer which preferably has a thickness between 10 nm and 1500 nm. The organic electronic component can have at least one bus bar, at least one metal grid, at least one metal grating, at least one metal strip and/or at least one metal mesh, for example in order to improve the current distribution. The mentioned elements can have a thickness between 10 nm and 1500 nm and be electrically insulated at least in regions relative to each other or relative to other elements by at least one of the structures made of passivation material.

Preferably, the passivation material has the dessicant in a concentration between 3 and 80 percent by weight, preferably in a concentration between 20 and 60 percent by weight. It is preferred in addition that the dessicant is distributed essentially homogeneously in the passivation material, there are therefore no local increases or reductions in concentration of the dessicant in the passivation material.

There are possible as materials for the passivation material, for example epoxides, polyimides, clays, minerals, acrylates or mixtures of these materials. The passivation material can comprise these materials proportionally or consist of them.

Preferably calcium oxide (CaO) and/or zeolite are possible for the dessicant.

The organic electronic component preferably has a substrate on which the components and layers are disposed and has preferably in addition a covering which protects the structures against influences from outside. Substrate and covering can be glued together by glue or adhesive. The glue can be applied here as a seam, structured or over the entire surface on the substrate and/or the covering. The adhesive layer can have a depth between 1 µm and 200 µm, preferably between 5 and 20 µm.

The organic electronic component can also have a glass cover and/or a cover film which are coated at least in regions with passivation material and/or with dessicant. The component can also have a glass cover which has at least one cavity in which passivation material and/or dessicant is disposed so that the passivation material or the dessicant fills the cavity at least partially.

The passivation material can be configured as a layer, structure or line with a thickness between 20 nm and 5000 µm, preferably between 100 nm and 10 µm, preferably between 20 nm and 5000 µm. The structures made of passivation material or the passivation layers should thereby be configured such that they conduct water sufficiently quickly to the embedded dessicant. There are suitable as materials for the passivation layer for this purpose in particular porous and water-transporting materials, for example clay, silicates.

In order to be able to survive the production process, the passivation should be temperature-stable, vacuum-stable, plasma-resistant and/or sputter-resistant.

For organic electronic components, it is in fact preferred in the case of optical components if the component has transparent conductive materials. These can be configured at least in regions as a layer.

If the lifespan of the organic electronic component is intended to be increased, then further surfaces of the substrate or even of the covering can be coated with passivation material and/or with dessicant.

The configuration according to the invention of the organic electronic component is particularly advantageous if the component is a light diode or a solar cell. In particular, also a display with a large number of pixels is according to the invention, the pixels being organic light diodes corresponding to the invention.

According to the invention, a method for the production of an organic electronic component is provided, according to which a component, as described above, is produced preferably. In a first method step, firstly one or more layers are applied hereby on a substrate, said layers having a conductive material or being conductive. In a second step, passivation material which contains at least one dessicant is then applied, for example on the conductive surface. In a third step, the passivation material is then processed and, in a fourth step, the substrate and/or at least parts of the structures applied thereon is coated at least in regions with at least one organic material.

Preferably, the step of mixing passivation material and dessicant is also a component of the method according to the invention. For this purpose, the dessicant can be mixed into the passivation material by rolling or tilt rolling, with an agitator, in particular a KPG agitator and/or a mixer.

In the second step, the passivation material can be applied in particular on the previously applied conductive surfaces and/or on edges of these conductive surfaces. The processing of the passivation material in the third step can comprise in particular UV crosslinking and/or a tempering step. In order to remove adsorbates, such as water and oxygen, the substrate can be heated after the third step under a dry inert atmosphere, under a nitrogen or argon atmosphere or also in a vacuum. As a result of this step, also the dessicant can be activated. This heating can be effected at temperatures between 80° C. and 400° C., preferably between 150° C. and 300° C. In particular the application of the conductive layers in the first step and also the coating with organic material in the fourth step can be effected in a vacuum.

After the fourth step, preferably at least one cover electrode is applied on the organic electronic component. The component can then be encapsulated under an inert, preferably essentially water-free atmosphere. Adhesive can hereby be applied firstly and subsequently the element can be encapsulated with a cover.

The organic electronic component according to the invention is distinguished in that it is particularly simple to produce, that it is very durable and the lifespan can be adjusted very precisely by the quantity of dessicant which is used. In addition, the component can be configured in a particularly simple manner such that moisture is conducted to the dessicant as rapidly as possible. A separate activation step for activating the dessicant is not necessary.

In the following, the organic electronic component according to the invention is intended to be described with reference to an embodiment. This example should not be understood to be restrictive, its features can also be used in other embodiments of the component.

DETAILED DESCRIPTION OF THE INVENTION

Figure 1:
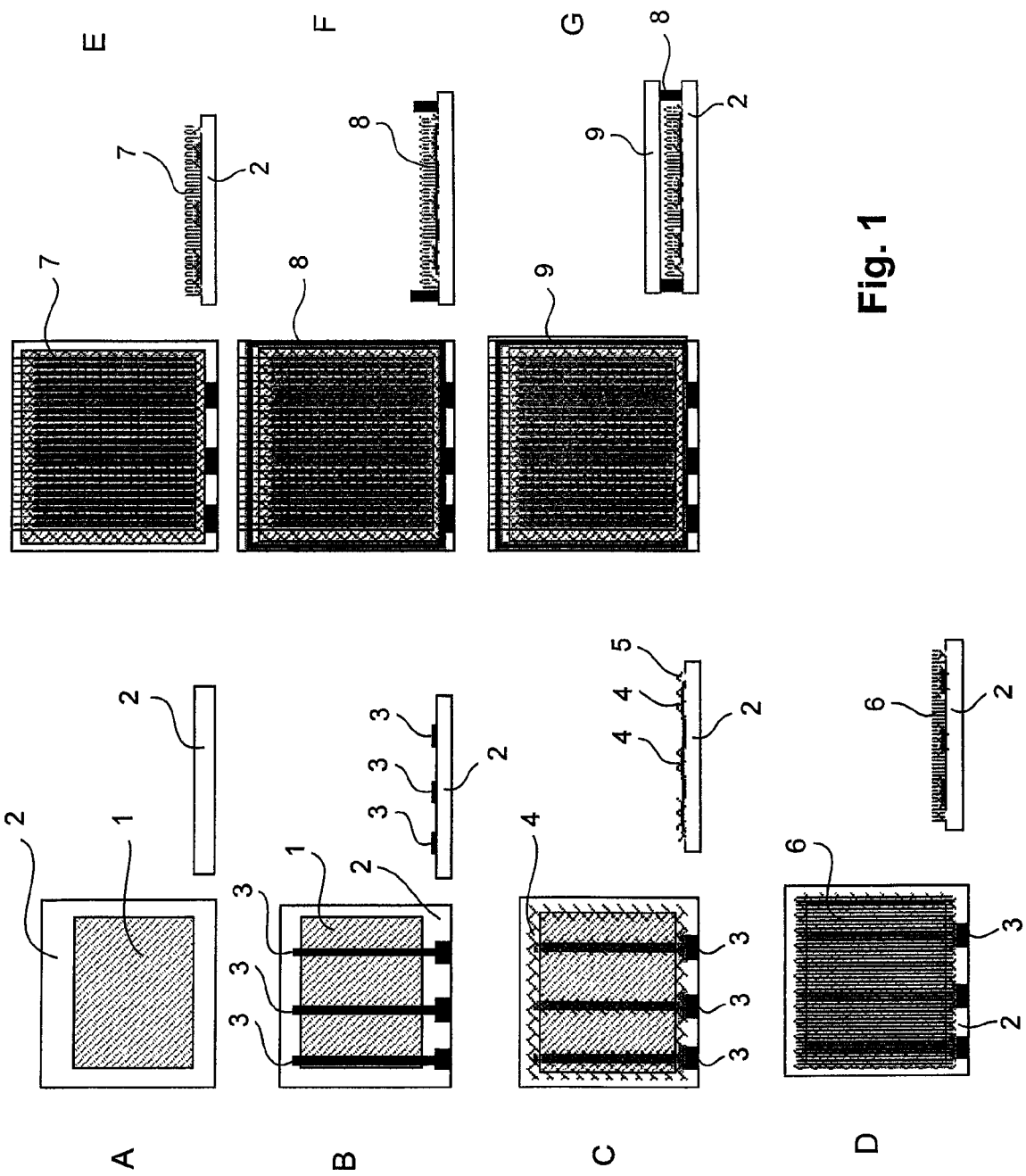
FIG. 1 shows the construction of an electronic component according to the invention, here of an organic light diode.

In FIG. 1, the production and the construction of an OLED with a passivation layer is represented schematically. On the left, the plan view on the surface is represented respectively, on the right a side view. The process is begun with a possibly prestructured, here rectangular, substrate 2, on which a rectangular, electrically conductive surface is applied (FIG. 1A) which is preferably transparent.

Since in particular transparent conductive materials have a higher electrical resistance, in comparison with metals such as copper, which makes it difficult to provide large surfaces uniformly with current, additional metal strips 3, meshes or similar structures, as represented in FIG. 1B, are applied. In the illustrated case, three parallel metal strips 3 are applied.

Because of the topology of these metal structures 3, the result can be short circuits in the subsequent component since the metal thickness is in the same thickness range (10-1500 nm) as the thickness of the organic layers. For this reason, the metal surfaces 3 and edges are provided with a passivation layer 4 (FIG. 1C) into which a dessicant, preferably a zeolite, has been mixed. Typical layer thicknesses are in the range of 0.1 to 10 µm. Non-required surfaces 5 can likewise be coated with a passivation material 4 containing dessicant. In these regions, also larger layer thicknesses are possible in order to increase the quantity of dessicant.

After the necessary process steps for processing the passivation, such as e.g. UV crosslinking, tempering etc., the substrate is heated in many cases under a dry inert atmosphere, e.g. nitrogen, argon, or even in a vacuum in order to remove adsorbed water. This heating at e.g. 80° C. to 400° C. serves simultaneously for activation of the dessicant since, directly subsequently, the coating with the organic materials 6 in the vacuum (FIG. 1D) is effected. Additional heating in the vacuum at 80° C. to 400° C. can improve the activation even more.

Subsequently, a cover electrode 7 (FIG. 1E) is applied and the coated substrate is encapsulated under an inert, water-free atmosphere. For this purpose, an adhesive 8 is applied firstly (FIG. 1F), as a seam which extends round the edge of the substrate 2 on the upper side thereof in the example, and the component is encapsulated with a cover 9 (FIG. 1G).

The invention claimed is:

1. An organic electronic component comprising:
    at least one structure having at least one passivation material, wherein the passivation material comprises at least one dessicant; and
    at least one bus bar, at least one metal grid, at least one metal grating, at least one metal strip and at least one metal mesh which is electrically insulated at least in parts by the at least one structure structuring the organic electronic component.

2. The organic electronic component according to claim 1, wherein the dessicant is mixed into the passivation material.

3. The organic electronic component according to claim 1, wherein the passivation material is electrically insulating.

4. The organic component according to claim 1, wherein the at least one structure has layers, structures or lines with a layer thickness between one of: about 20 nm and 5,000 μm, and about 100 nm and 10 μm.

5. The organic electronic component according to claim 1, wherein the at least one structure insulates parts of the organic electronic component electrically relative to each other.

6. The organic electronic component according to claim 1, wherein the at least one bus bar, at least one metal grid, at least one metal grating, at least one metal strip and/or at least one metal mesh, has a thickness of between 10 and 1500 nm, for improving the current distribution.

7. The organic electronic component according to claim 1, wherein one of the structures is disposed directly on ITO (indium-tin oxide) or in that at least one grid and/or at least one bus bar is disposed on ITO and at least one structure is disposed on the grid and/or the bus bar.

8. The organic electronic component according to claim 1, wherein the organic electronic component has at least one organic layer, with a thickness between 10 and 1500 nm.

9. The organic electronic component according to claim 1, wherein the passivation material has the dessicant in a concentration of 3 to 80 percent by weight.

10. The organic electronic component according to claim 1, wherein the dessicant in the passivation material is distributed essentially homogeneously.

11. The organic electronic component according to claim 1, wherein the passivation material comprises at least one of epoxides, polyimides, clays, minerals, acrylates or mixtures hereof.

12. The organic electronic component according to claim 1, wherein the dessicant comprises at least one of CaO and zeolite.

13. The organic electronic component according to claim 1, wherein the organic electronic component has a substrate and a covering and the substrate and the covering are glued together by adhesive.

14. The organic electronic component according to claim 1, wherein the organic electronic component has a glass cover and/or a cover film which is coated at least in regions with passivation material and/or dessicant.

15. The organic electronic component according to claim 1, wherein the organic electronic component has a glass cover which has at least one cavity, which are filled at least partially with passivation material and/or dessicant.

16. The organic electronic component according to claim 1, wherein the passivation material is present at least in regions as a layer with a layer thickness of between one of: about 20 nm and 5000 μm, and about 100 nm and 10 μm.

17. The organic electronic component according to claim 1, wherein the passivation material and/or the passivation layer is configured such that it conducts water sufficiently rapidly to the embedded dessicant.

18. The organic electronic component according to claim 1, wherein the passivation layer is temperature-stable and/or vacuum-stable and/or plasma-resistant and/or sputter-resistant.

19. The organic electronic component according to claim 1, wherein the organic electronic component comprises transparent conductive materials.

20. The organic electronic component according to claim 1, wherein further surfaces of the substrate are coated with passivation material and/or with dessicant.

21. The organic electronic component according to claim 1, wherein the organic electronic component is an organic light diode.

22. The organic electronic component according to claim 1, wherein the organic electronic component is an organic solar cell.

23. The organic electronic component according to claim 13, wherein the adhesive is applied as a seam, structured or over the entire surface of the substrate and/or the covering.

24. The organic electronic component according to claim 13, wherein the adhesive is applied with a depth of one of: between about 1 to 200 μm, and between about 5 to 20 μm.

25. The organic electronic component according to claim 19, wherein the transparent conductive materials are configured at least in regions as a layer.

26. A display with a large number of pixels, wherein the pixels have organic light diodes according to claim 21.

27. A method for the production of an organic electronic component, wherein,
    in a first step, firstly one or more conductive surfaces are applied on a substrate, the conductive surfaces being provided with at least one metal grid, at least one metal grating, at least one metal strip or at least one metal mesh,
    in a second step, passivation material which comprises at least one dessicant is applied to the conductive surfaces,
    in a third step, the passivation material is processed and,
    in a fourth step, the substrate and/or structures applied thereon are coated at least in regions with at least one organic material.

28. The method according to claim 27, wherein the dessicant is mixed into the passivation material by rollers, tilt rollers, with an agitator, a KPG agitator, and/or a mixer.

29. The method according to claim 27, wherein the passivation material is applied on conductive surfaces and/or on edges of conductive surfaces.

30. The method according to claim 27, wherein the processing of the passivation agent comprises, in the third step, UV crosslinking and/or tempering.

31. The method according to claim 27, wherein, after the third step, the substrate is heated under a dry inert gas atmosphere, under a nitrogen or argon atmosphere or in a vacuum in order to remove adsorbates, in particular water and oxygen, and to activate the dessicant.

32. The method according to claim 27, wherein the application of the conductive layers is effected in the first step and/or the coating in the vacuum in the fourth step.

33. The method according to claim 27, wherein, after the fourth step, at least one cover electrode is applied.

34. The method according to claim 27, wherein the organic electronic component is encapsulated under an inert, essentially water-free atmosphere.

35. The method according to claim 27, wherein an organic electronic component according to claim 1 is produced.

36. The method according to claim 31, wherein the heating is effected at a temperature between about 80° C. and 400° C.

37. The method according to claim 34, wherein firstly adhesive is applied for the encapsulation and subsequently encapsulation with a cover takes place.

* * * * *